United States Patent [19]

Osawa et al.

[11] Patent Number: 5,029,324
[45] Date of Patent: Jul. 2, 1991

[54] SEMICONDUCTOR DEVICE HAVING A SEMICONDUCTIVE PROTECTION LAYER

[75] Inventors: Akihiko Osawa, Tokyo; Yutaka Koshino; Yoshiro Baba, both of Yokohama, all of Japan

[73] Assignee: Kabushiki Kaisha Toshiba, Kawasaki, Japan

[21] Appl. No.: 512,013

[22] Filed: Apr. 16, 1990

Related U.S. Application Data

[63] Continuation of Ser. No. 236,400, Aug. 25, 1988, abandoned.

[30] Foreign Application Priority Data

Aug. 26, 1987 [JP] Japan .................. 62-211608

[51] Int. Cl.$^5$ .............. H01L 29/34; H01L 49/02; H01L 29/16; H01L 23/48
[52] U.S. Cl. ............................ 357/52; 357/2; 357/6; 357/61; 357/65
[58] Field of Search ............... 357/2, 6, 52, 61, 65

[56] References Cited

U.S. PATENT DOCUMENTS

| | | | |
|---|---|---|---|
| 4,134,125 | 1/1979 | Adams et al. | 357/54 |
| 4,177,474 | 12/1979 | Ovshinsky | 357/2 |
| 4,207,586 | 6/1980 | Lebailly | 357/52 |
| 4,339,285 | 2/1982 | Pankove | 357/52 |
| 4,362,766 | 12/1982 | Dannhäuser et al. | 357/52 |
| 4,375,993 | 3/1983 | Mori et al. | 357/91 |
| 4,381,201 | 7/1983 | Sakurai | 357/91 |
| 4,516,147 | 8/1985 | Komatsu et al. | 357/65 |
| 4,622,576 | 11/1986 | Buynoski | 357/71 |
| 4,672,420 | 6/1987 | Borodoosky et al. | 357/61 |
| 4,722,913 | 2/1988 | Miller | 357/6 |
| 4,862,227 | 8/1989 | Tsuge et al. | 357/52 |

FOREIGN PATENT DOCUMENTS 62-10029 3/1987 Japan .
1566072 4/1980 United Kingdom .

OTHER PUBLICATIONS

S. M. Sze, *Semiconductor Devices, Physics and Technology*, John Wiley & Sons, New York (1985) p. 38.
D. A. Anderson et al., "Electrical and Optical Properties of Amorphous Silicon Carbide, Silicon Nitride and Germanium Carbide Prepared by Glow Discharge Technique", *Philosophical Magazine*, vol. 35 (Jul. 1977) pp. 1-16.

*Primary Examiner*—J. Carroll
*Attorney, Agent, or Firm*—Finnegan, Henderson, Farabow, Garrett and Dunner

[57] ABSTRACT

A semiconductor device has a semiconductor region, an electrode layer formed over the semiconductor region, and a protection layer formed to cover the semiconductor region and the electrode layer. In the semiconductor device, the protection layer is a semiconductor protection layer. Part of the semiconductive protection layer is formed thin so as to have a low resistance, permitting a corresponding portion of the electrode layer to be connected to an external bonding wire.

6 Claims, 3 Drawing Sheets

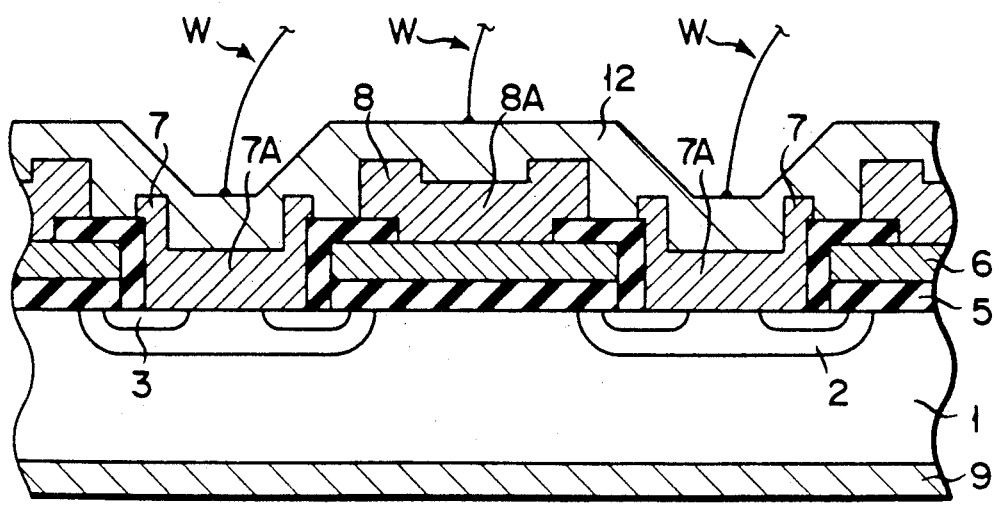
F I G. 3

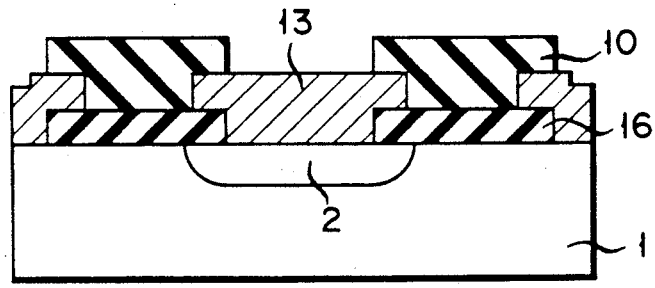
F I G. 7
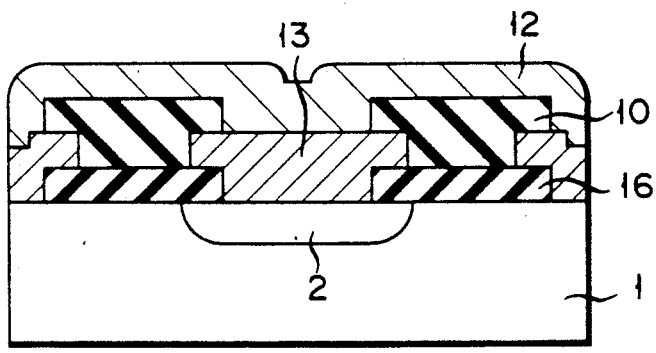
F I G. 8
|  | SEMI-CONDUCTIVE FILM | INSULATIVE FILM | STANDARD VALUE |
|---|---|---|---|
| $V_{DSS}$ ($I_{DSS}$=10nA) | 530 (V) | 540 (V) | 500 (V) |
| $I_{DSS}$ ($V_{DSS}$=500V) | 300 (nA) | 600 (nA) | 250 ($\mu$A) |
| Vth ($I_{DSS}/V_{DSS}$=1mA/10V) | 2.6 (V) | 2.8 (V) | 1.3~3.5 (V) |
F I G. 9

SEMICONDUCTOR DEVICE HAVING A SEMICONDUCTIVE PROTECTION LAYER

This application is a continuation of application Ser. No. 236,400, filed Aug. 25, 1988, abandoned.

BACKGROUND OF THE INVENTION

1. Field of the Invention

This invention relates to a semiconductor device, and more particularly to a semiconductor device having an electrode covered with a protection film.

2. Description of the Related Art

In general, the entire surface of a semiconductor device is covered with a final protection film such as a plasma SiN film after the metal wiring layer and electrode layer are formed. A hole is formed in the final protection film to partly expose the electrode layer so that the exposed portion thereof can be used as a bonding pad section. An external package pin is connected to the bonding pad section by a bonding technique.

In the manufacturing process, charges tend to be accumulated on the surface of the final protection film, and an electric field of the intensity corresponding to the amount of accumulated charges is applied to the active region. In order to reduce the intensity of the electric field, it is necessary to form the final protection film sufficiently thick so as to separate the surface of the final protection film away from the active region, for example.

FIG. 1 is a cross sectional view showing the construction of a conventional MOS power transistor. The MOS transistor includes semiconductor substrate 1 of one conductivity type, semiconductor layer 2 of an opposite conductivity type, semiconductor layer 3 of the one conductivity type, gate insulation layer 5, conductive gate electrode layer 6, metal source electrode 7, metal gate electrode 8, metal drain electrode 9 and insulative protection film 10.

In the MOS transistor, the protection film is relatively thick. However, if insulative protection film 10 is patterned as shown in FIG. 1 to expose partial areas 7A and 8A of metal electrodes 7 and 8 so as to use partial areas 7A and 8A as bonding pad sections, the moisture resistance of bonding pad sections 7A and 8A will be lowered.

FIG. 2 is a cross sectional view showing the construction of a MOS transistor disclosed in Japanese Patent specification No. 62-10029. Portions which are the same as those in FIG. 1 are denoted by the same reference numerals. The MOS transistor further includes field insulation layer 4 and thin conductive film 11. This conductive film 11 is formed of a semiconductor region of a high impurity concentration or metal, and is used to improve the moisture resistance of bonding pad sections 7A. In this case, field protection film 4 has the same function as that of final protection film 10 obtained when it is formed thick.

However, formation of thin conductive film 11 and insulation layer 4 makes the construction complex and increases the number of manufacturing steps, thereby lowering the productivity of the semiconductor device.

SUMMARY OF THE INVENTION

An object of this invention is to provide a semiconductor device which is simple in construction and in which the wire bonding can be effected without lowering the moisture resistance.

The object can be attained by a semiconductor device which comprises an active semiconductor layer; an electrode layer formed over the active semiconductor layer; and a semiconductive protection layer formed to cover the semiconductor active layer and the electrode layer, part of the semiconductor protection layer being formed thin on the electrode layer so as to have a low resistance, permitting a corresponding portion of the electrode layer to be electrically connected via the thin part of the semiconductive protection layer.

In the semiconductor device, since the protection film is formed of semiconductive material, the electric field corresponding to the amount of surface charges applied to the semiconductor active layer is weaker than that obtained in the case where an insulation layer is used. Further, since the resistance of the thin portion of the protection layer in a thickness direction is set to be sufficiently low, the corresponding portion of the electrode layer can be electrically connected to a wire via the thin portion of the protection layer by bonding the wire to the thin portion of the protection layer. In this case, since it is not necessary to form a hole in the semiconductive protection layer, the manufacturing process can be made simple. Further, since any part of the electrode layer is not exposed, deterioration of the moisture resistance of the electrode layer can be prevented.

BRIEF DESCRIPTION OF THE DRAWINGS

FIG. 3 is a cross sectional view of a MOS transistor according to one embodiment of this invention;

FIGS. 7 and 8 are cross sectional views showing the partial structure of a semiconductor device according to this invention in comparison with that of the conventional semiconductor device; and FIG. 9 is a diagram showing various characteristic values of the semiconductor device according to this invention in comparison with those of the conventional semiconductor device.

DETAILED DESCRIPTION OF THE PREFERRED EMBODIMENTS

Figure 1:
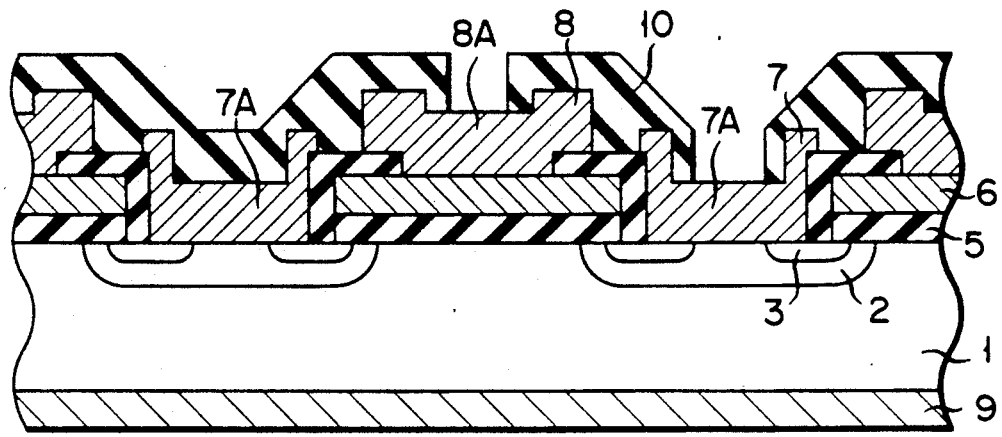
FIGS. 1 and 2 are cross sectional views showing the construction of conventional MOS power transistors.
Figure 2:
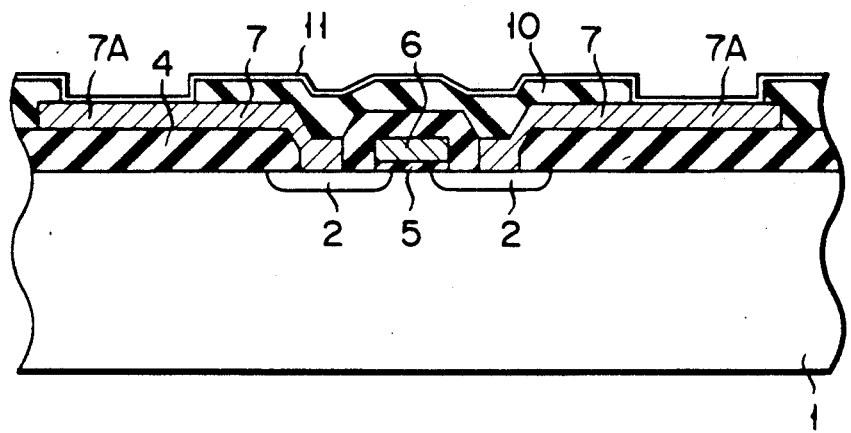

There will now be described a MOS power transistor according to one embodiment of this invention with reference to FIGS. 3 to 9. FIG. 3 is a cross sectional view of the power MOS transistor. In FIG. 3, portions which are the same as those in FIG. 1 are denoted by the same reference numerals, and the explanation thereof is omitted. As shown in FIG. 3, the power MOS transistor includes semiconductive protection film 12 formed in direct contact with electrode wiring layers 7 and 8. Layers 7 and 8 are distanced from each other by 20 to 30 $\mu$m. Semiconductive protection film 12 is formed of, for example, an amorphous SiC film and disposed to cover the upper surface of the MOS power transistor. Semiconductive protection film 12 is formed to have a resistivity of $10^7$ to $10^8$ $\Omega$·cm and a thickness of 1 μm on bonding portions 7A and 8A. The resistance of film 12 is so determined that the electrical characteristics of the semiconductor device (leak current flowing between the bonding pads, ON-resistance and the like) are not changed. Further, the thickness of semiconductive protection film 12 is so determined that electrodes 7 and 8 can be connected in good electrical contact with metal wire W when metal wire W is bonded to that portion of the semiconductive protection film which lies on bonding portions 7A and 8A. Amorphous film 12 is formed by a plasma CVD method. The plasma CVD method is effected by using parallel plate type plasma formation device in the following condition. That is, the deposition pressure is set at 0.65 Torr, the deposition temperature at 380° C., the gas flow rate ratio of $SiH_4/C_3H_8$ at 1/1, and the drive current at a value of 200 mA which is a minimum permissible value to initialize the plasma discharge. After amorphous SiC film 12 is formed as described above, wires W are bonded to those portions of amorphous SiC film 12 which lie over metal electrodes 7 and 8. As a result of this, wires W are electrically connected to metal electrodes 7 and 8. In this case, it is preferable to enhance the contact property between wires W and amorphous SiC film 12 by doping impurity into amorphous SiC film 12, or vapour depositing metal on film 12 and diffusing the deposited metal into film 12 in the heat treatment process.

Figure 4:
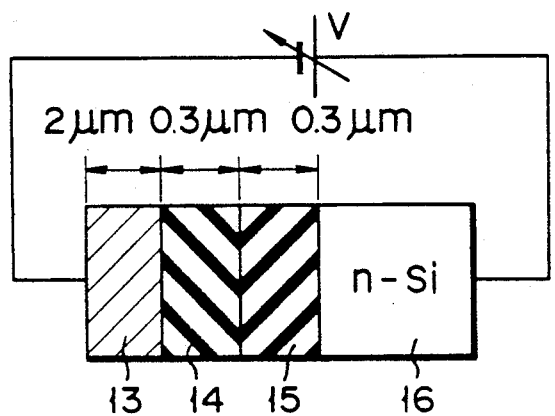
FIG. 4 is a view showing the construction of a varactor formed to measure the potential shielding characteristics.

A varactor as shown in FIG. 4 was formed to determine the potential shielding characteristics of the amorphous SiC film of the above embodiment and the conventional plasma SiN film. The condition in which plasma SiC film 15 was formed on N-type substrate 16 of the varactor was the same as that described before, and plasma SiC film 15 was formed to have a thickness of 0.3 μm. Further, the plasma SiN film was formed in a condition that the deposition pressure is set at 0.95 Torr, the deposition temperature at 380° C., the drive current at 250 mA, and the ratio of the gas flow rate $Si_4/NH_3$ is at 200/1840. The plasma SiO film was formed in a condition that the deposition pressure is set at 0.85 Torr, the deposition temperature at 300° C., the drive current at 100 mA, and the ratio of the gas flow rate $SiH_4/N_2O$ is at 47/2000. The plasma SiO film was formed to have a thickness of 0.3 μm. Further, Al electrode 13 was formed with a thickness of 2 μm by a vapour deposition method.

The discharge prevention property was checked as follows:

First, a device shown in FIG. 7 was formed, and the discharging voltage was measured by applying a reverse bias voltage between the Al electrode (base) and the rear surface of the substrate. After this, the plasma SiC film was formed on the entire surface of the semiconductor device of FIG. 8 in the condition as described before, and then a reverse bias voltage is applied between the Al electrode (base) and the rear surface of the substrate to measure the withstanding voltage of the semiconductor device.

Since the final protection film of the conventional semiconductor device is formed of an insulation layer, it is necessary to effect at least three steps, that is photoexposing step, etching step and resist removing step in the bonding pad area before the wire bonding process is effected. However, in the above embodiment, since the final protection film is formed of a semiconductive film, the above three steps can be omitted. In this case, no hole is formed in that portion of the protection film which corresponds to the bonding pad portion. Therefore, the moisture resistance property of the bonding pad in this embodiment can be improved in comparison with the prior art case.

FIG. 9 shows various characteristic values such as drain-source voltage $V_{DSS}$, drain-source current $I_{DSS}$ and threshold voltage Vth of the semiconductor device according to this embodiment using the semiconductive film together with those of the conventional semiconductor device using the insulation layer.

As is seen from FIG. 9, the electrical characteristics are not significantly changed by using the semiconductive film as the final protective film.

Figure 5:
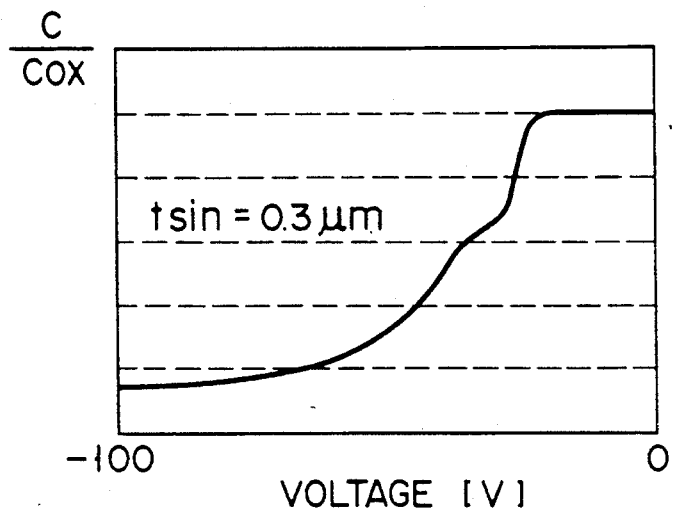
FIG. 5 is a potential shielding characteristic diagram obtained in the case a final protection film is formed of plasma SiN.
Figure 6:
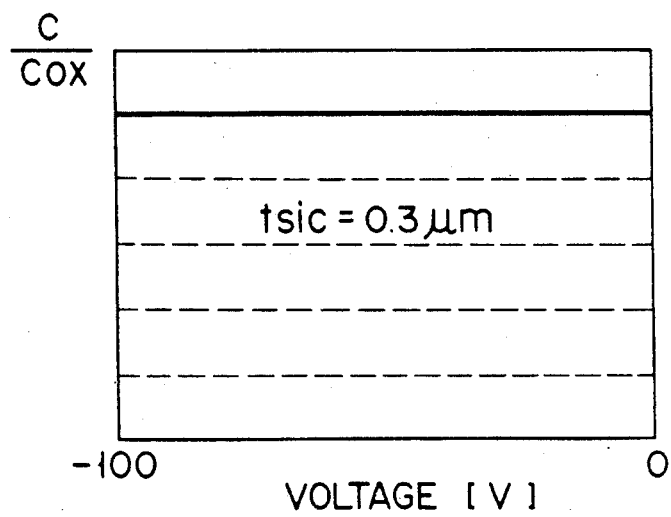
FIG. 6 is a potential shielding characteristic diagram obtained in the case a final protection film is formed of plasma SiC.

The varactor shown in FIG. 4 was formed to check the shielding property of amorphous SiC film 12, and a CV meter was used to detect variation in the capacitance according to variation in the voltage. The results of the measurement are shown in FIGS. 5 and 6. As is seen from FIGS. 5 and 6, the amorphous SiC film has a shielding effect more effective than the plasma SiN film which was used as the final protection film in the prior art. Therefore, in a case where the amorphous SiC film is used as the final protection film, the reliability of the semiconductor device can be maintained even if the protection film of the semiconductor device is formed thin.

With the construction shown in FIG. 7, a discharge occurred between the aluminum electrodes when a reverse bias voltage of 1200 V was applied. However, when the construction shown in FIG. 8 was used, neither the electromigration nor the discharge between the aluminum electrodes occurred even if a reverse bias voltage of more than 1600 V was applied. Therefore, if final protection film 12 of this embodiment is formed on the entire surface of the semiconductor device, the electromigration and the discharge between the electrodes can be effectively prevented.

In the semiconductor device shown in FIG. 3, the thickness of semiconductive protection film 12 is set to 1 μm, but can be changed in a range of 0.2 μm to 3 μm.

As described above, according to this invention, the semiconductive film having the function of a protection film is used to improve the moisture resistance of the metal electrodes without making the construction complex. Further, the amorphous semiconductor film having the shield property and the function of the protection film is used to reduce the thickness of the final protection film and field protection film. Further, in this case, the electromigration and the discharge between the electrodes can be prevented.

What is claimed is:

1. A semiconductor device comprising:
    an active semiconductor layer;
    an electrode layer formed over said active semiconductor layer; and
    a semiconductive protection layer means for covering said semiconductor active layer and said electrode layer, said semiconductor protection layer means having a substantially uniform composition and including at least one portion of thin cross section having a lower resistance in a thickness direction, relative to a resistance in a surface direction perpendicular to said thickness direction, for electrically connecting said electrode layer to an external element through the thin portion, a thickness of the thin portion being selected to provide a sufficiently low resistance in said thickness direction to enable electrical connection to said electrode layer and said resistance in said surface direction having a value sufficient to prevent flow of current along said surface direction and within a range of $10^7$ Ωcm to $10^8$ Ωcm.

2. A semiconductor device according to claim 1, wherein said amorphorus SiC film contains impurity doped to control the resistivity thereof.

3. A semiconductor device according to claim 2, wherein said semiconductor protection layer means is formed of an amorphous SiC film and the thickness of said amorphous SiC film is set within a range of 0.2 μm to 3 μm.

4. A semiconductor device according to claim 1, wherein said semiconductive layer means is substantially free from added impurities.

5. A semiconductor device according to claim 4, wherein said semiconductor protection layer means is formed of an amorphous SiC film.

6. A semiconductor device according to claim 4, wherein the thickness of said semiconductive protection layer means is set within a range of 0.2 μm to 3 μm.

* * * * *